(12) United States Patent
Ban et al.

(10) Patent No.: US 7,666,796 B2
(45) Date of Patent: Feb. 23, 2010

(54) SUBSTRATE PATTERNING FOR MULTI-GATE TRANSISTORS

(75) Inventors: Ibrahim Ban, Beaverton, OR (US); Uday Shah, Portland, OR (US); Allen B. Gardiner, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 505 days.

(21) Appl. No.: 11/388,526

(22) Filed: Mar. 23, 2006

(65) Prior Publication Data

US 2007/0224815 A1 Sep. 27, 2007

(51) Int. Cl.
*H01L 21/302* (2006.01)

(52) U.S. Cl. ............... 438/719; 438/723; 438/724; 438/725; 438/734; 438/735; 438/738; 438/743; 438/744; 216/67

(58) Field of Classification Search ............... 438/738
See application file for complete search history.

(56) References Cited

U.S. PATENT DOCUMENTS

| | | | | |
|---|---|---|---|---|
| 5,851,927 | A * | 12/1998 | Cox et al. | 438/744 |
| 6,696,365 | B2 * | 2/2004 | Kumar et al. | 438/706 |
| 6,940,170 | B2 * | 9/2005 | Parikh | 257/750 |
| 7,005,366 | B2 | 2/2006 | Chau et al. | |
| 2005/0121412 | A1 * | 6/2005 | Beintner et al. | 216/11 |
| 2006/0118876 | A1 * | 6/2006 | Lee et al. | 257/365 |

* cited by examiner

*Primary Examiner*—Anita K Alanko
(74) *Attorney, Agent, or Firm*—Kenneth A. Nelson (57) ABSTRACT

Some embodiments of the present invention include apparatuses and methods relating to improved substrate patterning for multi-gate transistors.

15 Claims, 6 Drawing Sheets

SUBSTRATE PATTERNING FOR MULTI-GATE TRANSISTORS

TECHNICAL FIELD

Embodiments of the invention relate to semiconductor processing technology. In particular, embodiments of the invention relate to enhanced substrate patterning for multi-gate transistors.

BACKGROUND

In the production of microelectronic products, transistors are typically formed on a substrate and interconnected into integrated circuits that perform numerous useful functions. In some applications, multi-gate non-planar transistors, such as double gate or floating body cell (FBC) transistors, may be employed. In the fabrication of multi-gate transistors, a fin provides the channel region of the transistor. In double gate or FBC transistors, the fin typically includes a silicon element that provides the channel material of the transistor and an insulative cap over the silicon element.

Figure 1A:
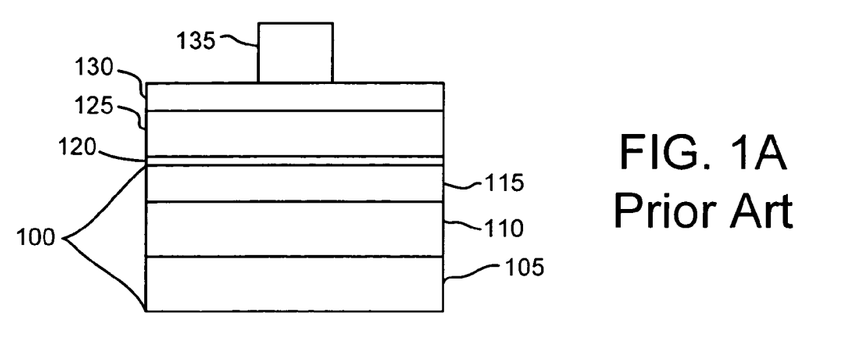
FIGS. 1A-1D are cross-sectional views of a prior art method of forming a multi-gate transistor fin including silicon, oxide, and a nitride cap.

FIGS. 1A-1D illustrate prior art methods of forming a fin for a multi-gate non-planar transistor. FIG. 1A illustrates a silicon on insulator (SOI) substrate 100 including a bulk silicon layer 105, an insulator layer 110, and a silicon layer 115. FIG. 1A also illustrates an oxide layer 120, a nitride layer 125, a hard mask layer 130, and a resist pattern 135.

Figure 1B:
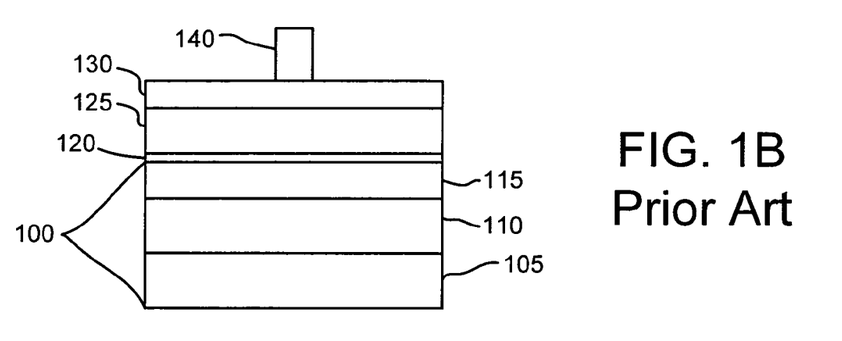

As illustrated in FIG. 1B, an optional trim step may be performed to trim resist pattern 135 to resist pattern 140. Typically, resist pattern 140 has smaller critical dimensions than resist pattern 135.

Figure 1C:
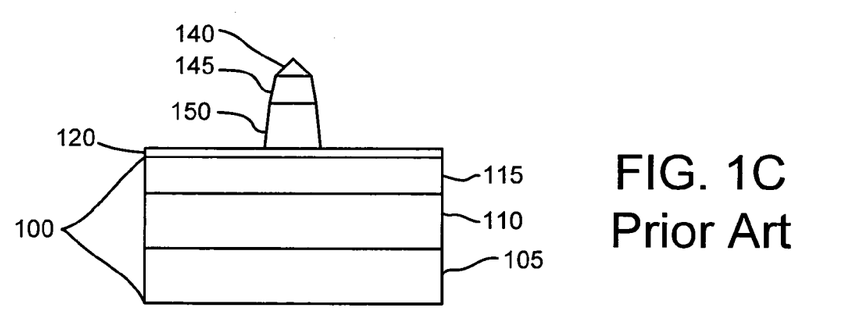

As illustrated in FIG. 1C, an etch is typically performed to remove portions of hard mask layer 130 and nitride layer 125 that are not covered by resist pattern 135 to form a patterned hard mask layer 145 and a patterned nitride layer 150. Hard mask layer 130 and nitride layer 125 are typically etched with similar chemistries without an inherent etch selectivity between them.

The etch process that removes portions of nitride layer 125 and hard mask layer 130 has numerous difficulties. For example, as shown, resist pattern 140 is partially consumed during the etch process. The consumption of resist pattern 140 may cause poor profile control in patterned hard mask layer 145 and/or patterned nitride layer 150, and may cause a trapezoidal patterned hard mask layer 145 and/or nitride layer 145 as shown in FIG. 1C. Patterned hard mask layer 145 and patterned nitride layer 150 may also include undesired line edge roughness and poor critical dimension (CD) control. Further, in an effort to make transistors smaller and faster, critical dimensions must be reduced. However, the illustrated method limits the aspect ratio and critical dimension of patterned nitride layer 150 and therefore limits the desired scaling to smaller transistors.

Figure 1D:
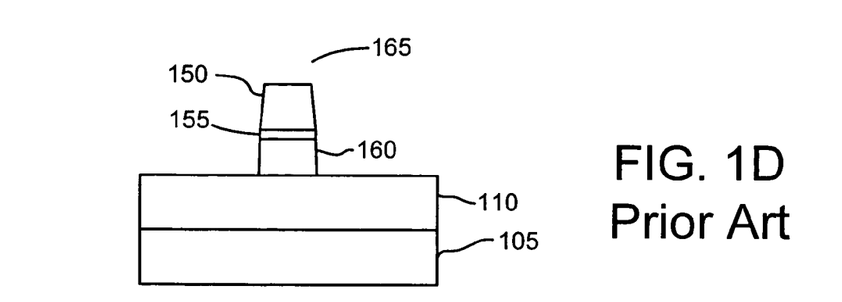

As illustrated in FIG. 1D, resist pattern 140 may be removed, and portions of oxide layer 120 and silicon layer 115 may be removed to form patted oxide layer 155 and patterned silicon layer 160. Patterned silicon layer 160, pattered oxide layer 155, patterned carbon doped nitride 150, and, optionally, patterned hard mask layer 145 make up a fin 160 that is used to form a multi-gate non-planar transistor by known methods.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, apparatuses and methods relating to semiconductor processing are described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In the fabrication of multi-gate non-planar transistors, it may be desirable to manufacture a fin that includes a channel element that provides the channel of the transistor and an insulative cap over the channel element. Further, it may be desirable that the channel element and the insulative cap have a high aspect ratio (height to width ratio), small critical dimensions, and substantially vertical sidewalls. Briefly, the present invention may provide structures and methods that provide for fins having channel elements and insulative caps with high aspect ratios, small critical dimensions, and substantially vertical sidewalls.

FIGS. 2A-2E illustrate methods and apparatuses for fabricating multi-gate transistor fins.

Figure 2A:
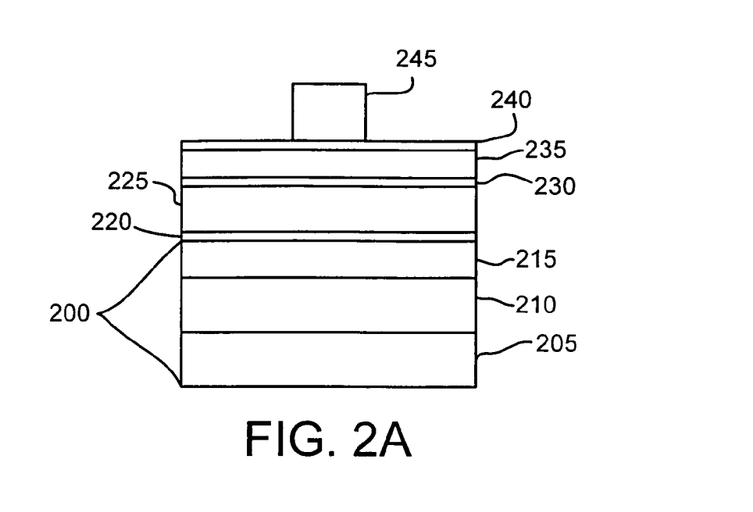
FIG. 2A is a cross-sectional view of a material stack on a substrate and a pattern layer on the material stack.

FIG. 2A illustrates a substrate 200 including a bulk substrate layer 205, an insulative layer 210, and a substrate layer 215. Substrate 200 may include any suitable materials. In particular, substrate layer 215 may include any material that provides a suitable channel material for a multi-gate transistor, insulative layer 210 may include any dielectric material, and bulk substrate layer 205 may include any material that provides a suitable support structure. In an embodiment, bulk substrate layer 205 may include silicon, insulative layer 210 may include silicon dioxide, and substrate layer 215 may include silicon. In such embodiments, substrate 200 may be generally referred to as a silicon on insulator (SOI) substrate.

FIG. 2A also illustrates layers 220, 225, 230, 235, and 240, and pattern layer 245. Layer 225 may include any material that provides a suitable insulative cap for a multi-gate transistor fin. In an embodiment, layer 225 may include a nitride. In an embodiment, layer 225 may include a carbon doped nitride. Layer 235 may include any suitable hard-mask material. In some embodiments, layer 235 may also provide an anti-reflective coating layer. In an embodiment, layer 235 may include a nitride. In another embodiment, layer 235 may include a silicon rich nitride. In an embodiment, layer 235 may include a silicon oxynitride. In some embodiments, layer 235 and layer 225 may not have an intrinsic etch selectivity between them. In general an etch selectivity may include a relationship between two materials such that a properly chosen etchant chemistry may substantially etch one material without substantially etching the other material.

Layers 220, 230, and 240 may include any suitable materials that have an etch selectivity with respect to layer 225, layer 235, and substrate layer 215. In an embodiment, layer 220 may include an oxide. In another embodiment, layer 230 may include an oxide. In an embodiment, layer 240 may include an oxide. In an embodiment, layers 220, 230, and 240 may include the same or similar materials. In other embodiments, layers 220, 230, and 240 may include different materials, so long as they include the desired etch selectivity characteristics.

Patterned layer 245 may include any suitable patterning material and may be formed by any suitable technique. In an embodiment, patterned layer 245 may include a resist. Patterned layer 245 may cover a region of layer 240 while exposing another region of layer 240. Likewise, patterned layer 245 may be over and cover a region of layers 220, 225, 230, 235, and 240, and substrate 220 such that another region of layers 220, 225, 230, 235, and 240, and substrate 220 is not covered by, and is therefore exposed by, patterned layer 245. In an embodiment, patterned layer 245 may have a width or critical dimension less than about 40 nm. In another embodiment, patterned layer 245 may have a width or critical dimension less than about 30 nm. In an embodiment, patterned layer 245 may have a width or critical dimension in the range of about 20 to 40 nm. In an embodiment, layer 235 may provide an anti-reflective coating (ARC) for improved patterning of patterned layer 245.

Figure 2B:
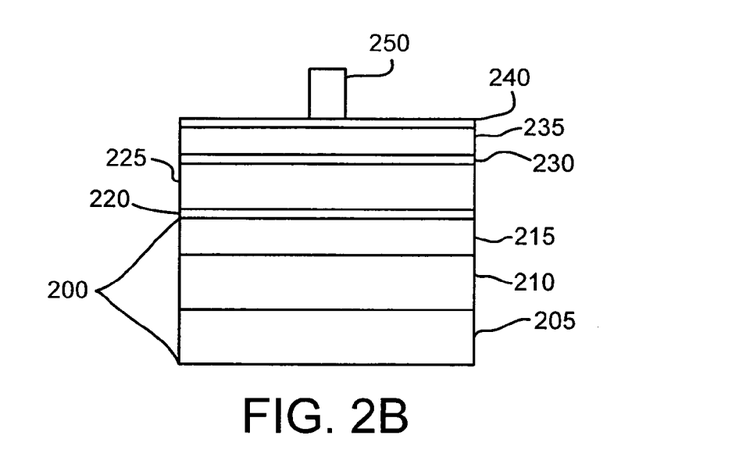
FIG. 2B is a view similar to FIG. 2A with the pattern layer trimmed.

As illustrated in FIG. 2B, an optional trim step may be performed to trim patterned layer 245 to patterned layer 250. In an embodiment, the optional trim step may reduce the critical dimensions of patterned layer 245. The trim may be performed by any suitable technique, such as a resist trim etch. As discussed with respect to FIG. 2A, patterned layer 250 may be over and cover a region of layers 220, 225, 230, 235, and 240, and substrate 220 such that another region of layers 220, 225, 230, 235, and 240, and substrate 220 is not covered, and is therefore exposed by, by patterned layer 250. In an embodiment, patterned layer 250 may have a width or critical dimension less than about 40 nm. In another embodiment, patterned layer 250 may have a width or critical dimension less than about 30 nm. In an embodiment, patterned layer 250 may have a width or critical dimension in the range of about 20 to 40 nm. In an embodiment, the trim etch may not be performed.

Figure 2C:
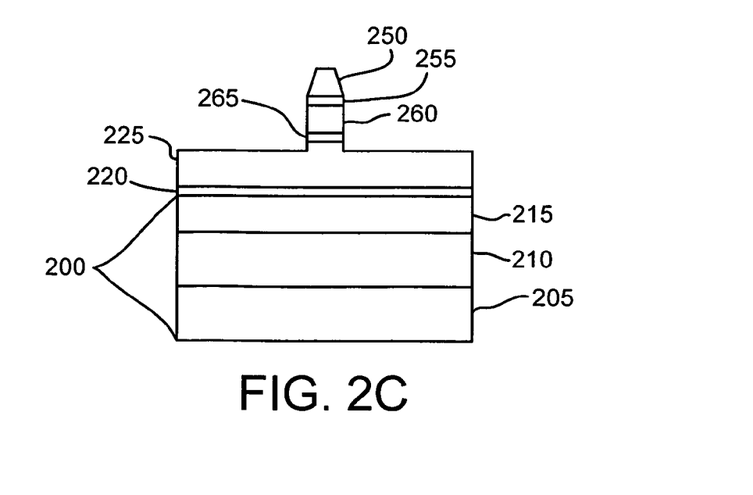
FIG. 2C is a view similar to FIG. 2B with an exposed region of the fifth, fourth, and third layers of the material stack removed.

As illustrated in FIG. 2C, uncovered portions of layers 240, 235, and 230 may be etched to form patterned layers 255, 260, and 265. In an embodiment, the etch may consume part of patterned layer 250. In an embodiment, the etch may also remove a portion of layer 225. In another embodiment, a portion of layer 225 may not be removed. In an embodiment, the etch may include an anisotropic dry etch. In an embodiment, the etch may be a timed etch to correspond with the consumption of patterned layer 250 such that the etch is stopped when patterned layer 250 is at or near the point of not providing a quality etch mask. In an embodiment, the timed etch may have a duration in the range of about 30 to 60 seconds. In another embodiment, the timed etch may have duration in the range of about 40 to 120 seconds. In an embodiment, the timed etch may have a duration in the range of about 40 to 80 seconds.

Figure 2D:
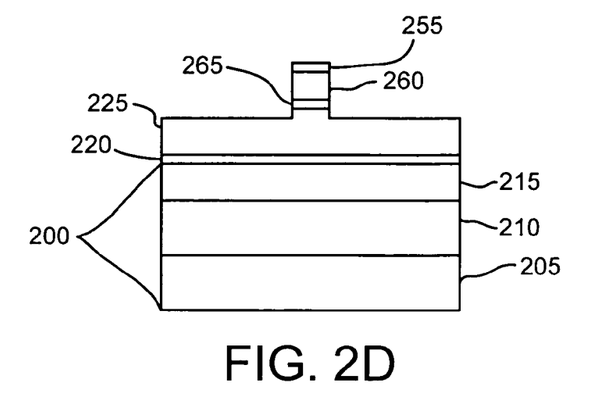
FIG. 2D is a view similar to FIG. 2C with the pattern layer removed.

As illustrated in FIG. 2D, patterned layer 250 may be removed by any suitable technique, such as a resist strip.

Figure 2E:
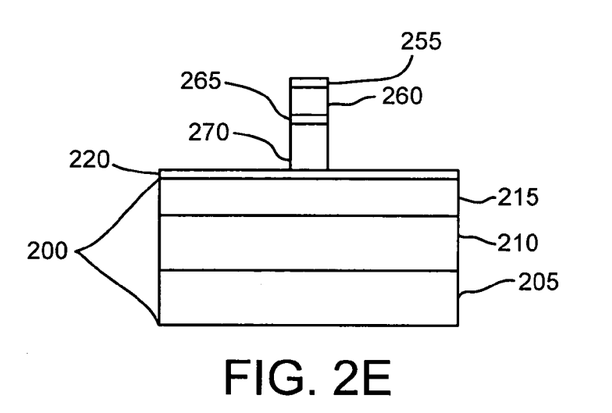
FIG. 2E is a view similar to FIG. 2D with an exposed region of the second layer of the material stack removed.

As illustrated in FIG. 2E, layer 225 may be etched to form a patterned layer 270. In an embodiment, the etch may include an etchant chemistry that selectively etches the material of patterned layer 270 without substantially etching the materials of patterned layer 255 and patterned layer 265. In an embodiment, the etch may use patterned layer 255 as a mask for the removal of portions of layer 225. In an embodiment, patterned layer 255 may protect patterned layer 260 and patterned layer 265 may eliminate or reduce any undercut etch into patterned layer 260. In an embodiment, the etch may include an anisotropic dry etch.

Figure 2F:
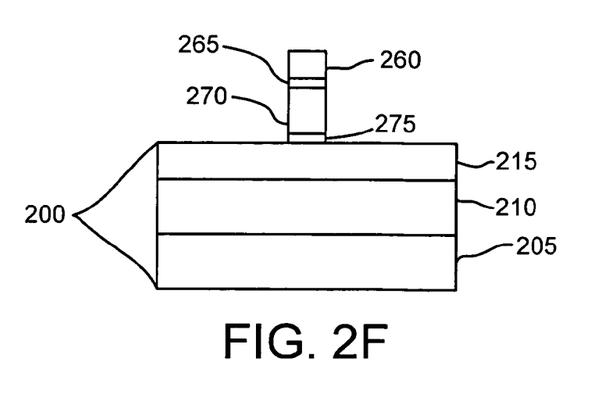
FIG. 2F is a view similar to FIG. 2E with an exposed region of the first layer of the material stack and the remainder of the fifth layer of the material stack removed.

As illustrated in FIG. 2F, an etch may be performed to remove patterned layer 255 and to remove a portion of layer 220 to form patterned layer 275. In an embodiment, the etch may include an etchant chemistry that selectively etches the materials of patterned layer 255 and layer 220 without selectively etching the material patterned layer 260. In another embodiment, a timed etch may be used. In an embodiment, the etch may include an anisotropic dry etch.

Figure 2G:
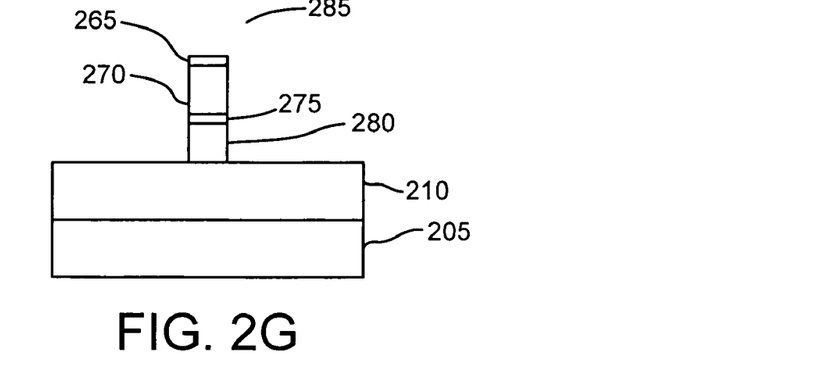
FIG. 2G is a view similar to FIG. 2F with part of an exposed region of the substrate and the remainder of the fourth layer of the material stack removed to form a fin for a multi-gate transistor.

As illustrated in FIG. 2G, an etch may be performed to remove patterned layer 260 and to remove a portion of substrate layer 215 to form a patterned layer 280, and to form a fin 285. In an embodiment, the etch may include an etchant chemistry that selectively etches the materials of patterned layer 260 and substrate layer 215 without substantially etching the materials of patterned layer 265 or insulative layer 210. In an embodiment, the etch may include an anisotropic dry etch. In an embodiment, patterned layer 260 may not be removed and patterned layer 260 may be part of fin 285.

Fin 285 may provide a fin for any suitable multi-gate non-planar transistor which may be formed by known techniques. In an embodiment, fin 285 may provide a fin for a double gate transistor. In another embodiment, fin 285 may provide a fin for a floating body cell transistor.

FIGS. 3A-3E illustrate methods and apparatuses for fabricating multi-gate transistor fins.

Figure 3A:
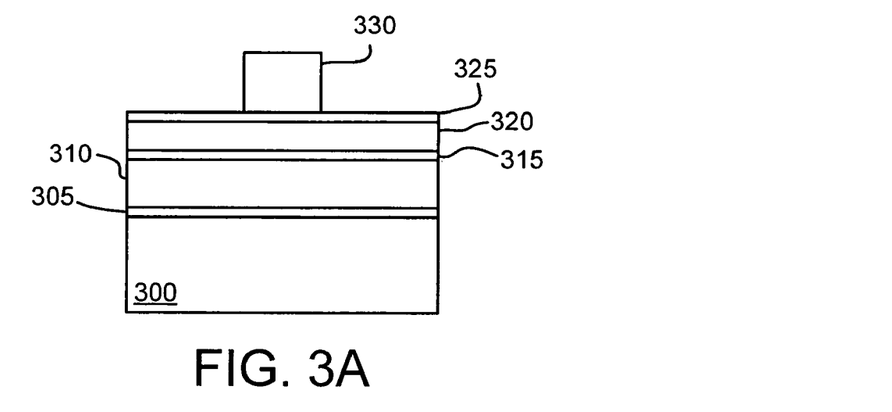
FIG. 3A is a cross-sectional view of a material stack on a substrate and a pattern layer on the material stack.

FIG. 3A illustrates a substrate 300. Substrate 300 may include any suitable material or materials such as silicon, germanium, gallium arsenide, indium phosphide, or the like. FIG. 3A also illustrates layers 305, 310, 315, 320, and 325, and pattern layer 330. Layer 310 may include any material that provides a suitable insulative cap for a multi-gate transistor fin. In an embodiment, layer 310 may include a nitride. In an embodiment, layer 310 may include a carbon doped nitride. Layer 320 may include any suitable hard-mask material. In some embodiments, layer 320 may also provide an anti-reflective coating layer. In an embodiment, layer 320 may include a nitride. In another embodiment, layer 320 may include a silicon rich nitride. In an embodiment, layer 320 may include a silicon oxynitride. In some embodiments, layer 320 and layer 310 may not have an intrinsic etch selectivity between them.

Layers 305, 315, and 325 may include any suitable materials that have an etch selectivity with respect to layer 310, layer 320, and substrate 300. In an embodiment, layer 305 may include an oxide. In another embodiment, layer 315 may include an oxide. In an embodiment, layer 325 may include an oxide. In an embodiment, layers 305, 315, and 325 may include the same or similar materials. In other embodiments, layers 305, 315, and 325 may include different materials, so long as they include the desired etch selectivity characteristics.

Patterned layer 330 may include any suitable patterning material and may be formed by any suitable technique. In an embodiment, patterned layer 330 may include a resist. Patterned layer 330 may cover a region of layer 325 while exposing another region of layer 325. Likewise, patterned layer 330 may be over and cover a region of layers 305, 310, 315, 320, and 325, and substrate 305 such that another region of layers 305, 310, 315, 320, and 325, and substrate 305 is not covered by, and is therefore exposed by, patterned layer 330. In an embodiment, patterned layer 330 may have a width or critical dimension less than about 40 nm. In another embodiment, patterned layer 330 may have a width or critical dimension less than about 30 nm. In an embodiment, patterned layer 330 may have a width or critical dimension in the range of about 20 to 40 nm. In an embodiment, layer 320 may provide an anti-reflective coating (ARC) for improved patterning of patterned layer 330.

Figure 3B:
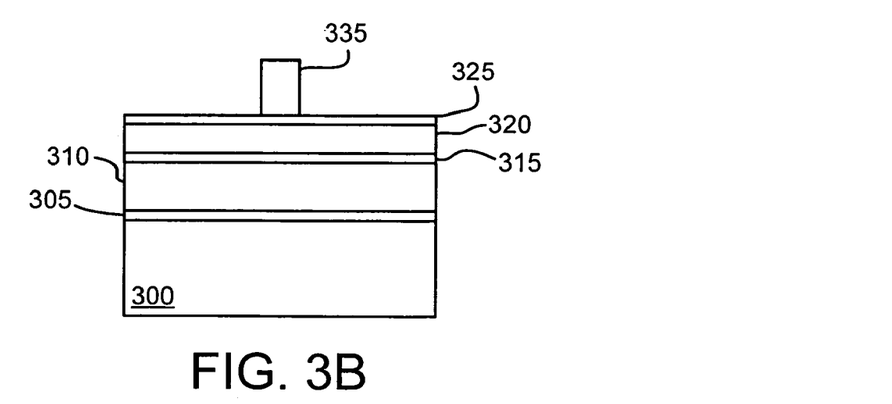
FIG. 3B is a view similar to FIG. 3A with the pattern layer trimmed.

As illustrated in FIG. 3B, an optional trim step may be performed to trim patterned layer 330 to patterned layer 335. In an embodiment, the optional trim step may reduce the critical dimensions of patterned layer 330. The trim may be performed by any suitable technique, such as a resist trim etch. As discussed with respect to FIG. 3A, patterned layer 335 may be over and cover a region of layers 305, 310, 315, 320, and 325, and substrate 305 such that another region of layers 305, 310, 315, 320, and 325, and substrate 305 is not covered, and is therefore exposed by, by patterned layer 335. In an embodiment, patterned layer 335 may have a width or critical dimension less than about 40 nm. In another embodiment, patterned layer 335 may have a width or critical dimension less than about 30 nm. In an embodiment, patterned layer 335 may have a width or critical dimension in the range of about 20 to 40 nm. In an embodiment, the trim etch may not be performed.

Figure 3C:
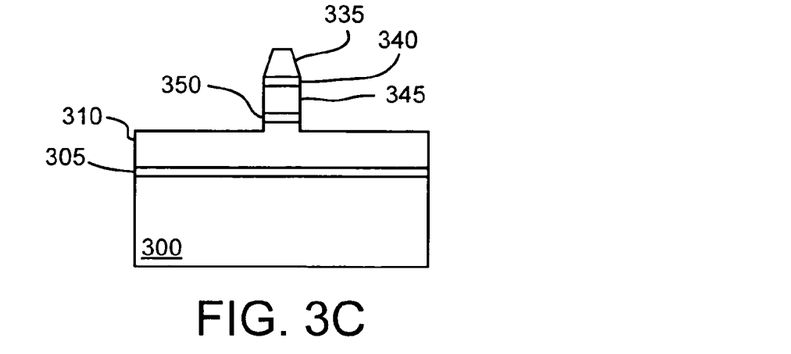
FIG. 3C is a view similar to FIG. 3B with an exposed region of the fifth, fourth, and third layers of the material stack removed.

As illustrated in FIG. 3C, uncovered portions of layers 325, 320, and 315 may be etched to form patterned layers 340, 345, and 350. In an embodiment, the etch may consume part of patterned layer 335. In an embodiment, the etch may also remove a portion of layer 310. In another embodiment, a portion of layer 310 may not be removed. In an embodiment, the etch may include an anisotropic dry etch. In an embodiment, the etch may be a timed etch to correspond with the consumption of patterned layer 335 such that the etch is stopped when patterned layer 335 is at or near the point of not providing a quality etch mask. In an embodiment, the timed etch may have a duration in the range of about 30 to 60 seconds. In another embodiment, the timed etch may have duration in the range of about 40 to 120 seconds. In an embodiment, the timed etch may have a duration in the range of about 40 to 80 seconds.

Figure 3D:
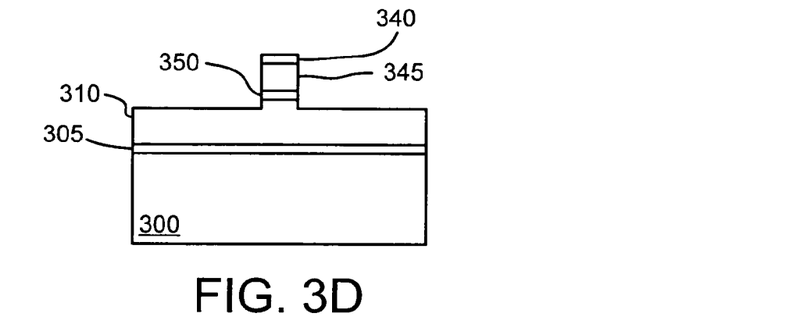
FIG. 3D is a view similar to FIG. 3C with the pattern layer removed.

As illustrated in FIG. 3D, patterned layer 335 may be removed by any suitable technique, such as a resist strip.

Figure 3E:
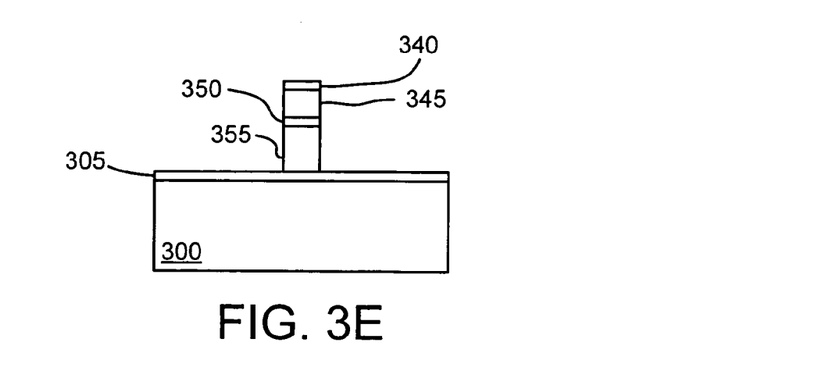
FIG. 3E is a view similar to FIG. 3D with an exposed region of the second layer of the material stack removed.

As illustrated in FIG. 3E, layer 310 may be etched to form a patterned layer 355. In an embodiment, the etch may include an etchant chemistry that selectively etches the material of patterned layer 355 without substantially etching the materials of patterned layer 340 and patterned layer 350. In an embodiment, the etch may use patterned layer 340 as a mask for the removal of portions of layer 310. In an embodiment, patterned layer 340 may protect patterned layer 345 and patterned layer 350 may eliminate or reduce any undercut etch into patterned layer 345. In an embodiment, the etch may include an anisotropic dry etch.

Figure 3F:
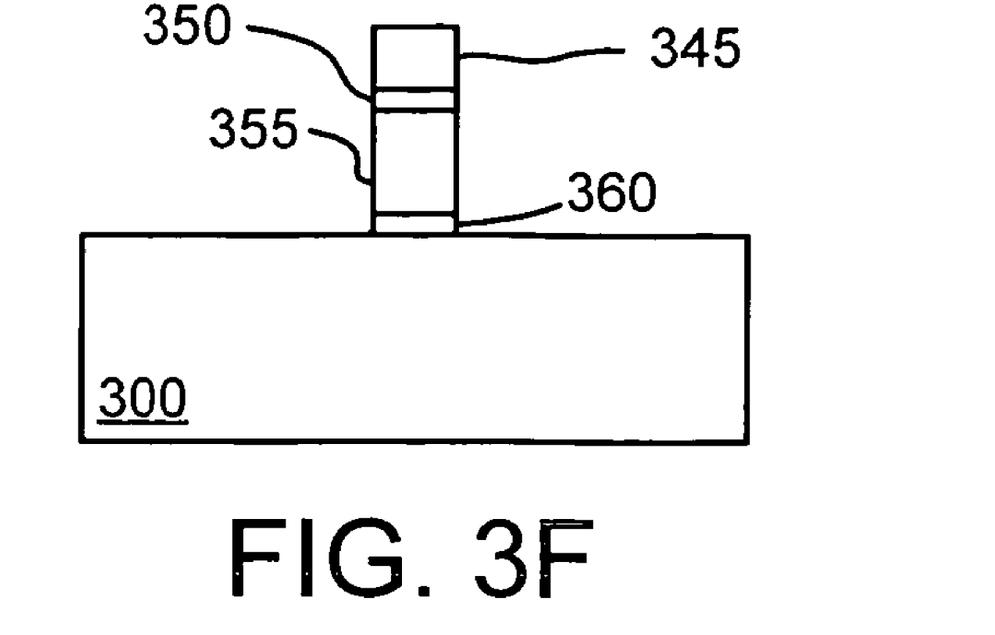
FIG. 3F is a view similar to FIG. 3E with an exposed region of the first layer of the material stack and the remainder of the fifth layer of the material stack removed.

As illustrated in FIG. 3F, an etch may be performed to remove patterned layer 340 and to remove a portion of layer 305 to form patterned layer 360. In an embodiment, the etch may include an etchant chemistry that selectively etches the materials of patterned layer 340 and layer 305 without selectively etching the material patterned layer 345. In another embodiment, a timed etch may be used. In an embodiment, the etch may include an anisotropic dry etch.

Figure 3G:
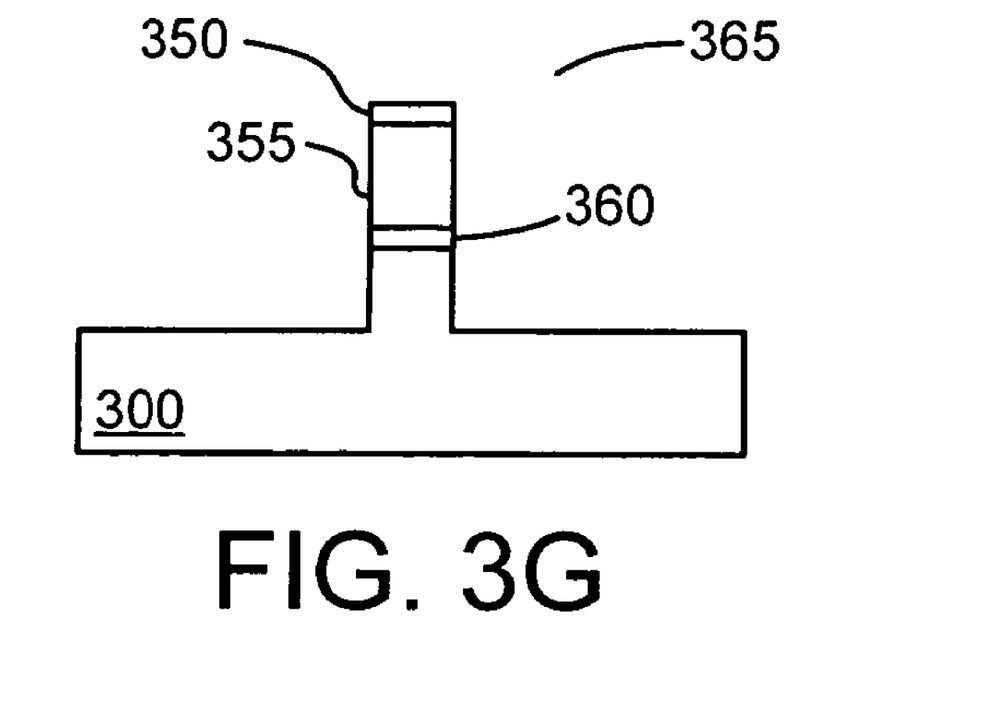
FIG. 3G is a view similar to FIG. 3F with part of an exposed region of the substrate and the remainder of the fourth layer of the material stack removed to form a fin for a multi-gate transistor.

As illustrated in FIG. 3G, an etch may be performed to remove patterned layer 345 and to remove a portion of substrate 300 to form a fin 365. In an embodiment, the etch may include an etchant chemistry that selectively etches the materials of patterned layer 345 and substrate 300 without substantially etching the material of patterned layer 350. In an embodiment, the etch may include an anisotropic dry etch. In another embodiment, the etch may include a timed etch. In an embodiment, patterned layer 345 may not be removed and patterned layer 345 may be part of fin 365.

Fin 365 may provide a fin for any suitable multi-gate non-planar transistor which may be formed by known techniques. In an embodiment, fin 365 may provide a fin for a double gate transistor. In another embodiment, fin 365 may provide a fin for a floating body cell transistor.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
   providing a material stack on a substrate, wherein the material stack includes a first layer on the substrate, a second layer on the first layer, a third layer on the second layer, a fourth layer on the third layer, and a fifth layer on the fourth layer, and wherein there is etch selectivity between the second layer and the fifth layer, and between the substrate and the third layer;
   forming a pattern over the fifth layer, wherein the pattern exposes a first region of the material stack and the substrate, and covers a second region of the material stack and the substrate;
   etching the first region of the fifth layer, the fourth layer, and the third layer, wherein etching the first region of the fifth layer, the fourth layer, and the third layer further comprises removing a first portion of the pattern while leaving a second portion of the pattern in place, and wherein the first portion of the pattern represents a maximum amount that may be removed from the pattern and still allow the pattern to be capable of providing an etch mask;
   removing the second portion of the pattern;
   etching the first region of the second layer;
   etching the second region of the fifth layer and the first region of the first layer; and
   etching the second region of the fourth layer and a part of the first region of the substrate.

2. The method of claim 1, wherein etching the first region of the fifth layer, the fourth layer, and the third layer comprises a timed etch.

3. The method of claim 1, wherein etching the first region of the second layer comprises an etch chemistry that selectively etches the first region of the second layer without substantially etching the first region of the fifth layer.

4. The method of claim 1, wherein the first layer, the third layer, and the fifth layer comprise an oxide.

5. The method of claim 1, wherein the second layer comprises a nitride.

6. The method of claim 1, wherein the fourth layer comprises a silicon rich nitride.

7. The method of claim 1, wherein the substrate comprises a silicon substrate.

8. The method of claim 1, wherein the substrate comprises a silicon on insulator substrate and the part of the first region of the substrate comprises silicon.

9. The method of claim 1, wherein the substrate comprises silicon.

10. A method comprising:
    providing a material stack on a substrate including a silicon layer, an insulator layer, and a bulk substrate layer, wherein the material stack includes an oxide layer on the silicon layer, a nitride layer on the oxide layer, a second oxide layer on the nitride layer, a hard mask layer on the second oxide layer, and a third oxide layer on the hard mask layer;
    forming a resist pattern over the third oxide layer, wherein the material stack and the substrate include a first region covered by the resist pattern and a second region exposed by the resist pattern;
    etching the second region of the third oxide layer, the hard mask layer, and the second oxide layer, wherein etching the second region of the third oxide layer, the hard mask layer, and the second oxide layer further comprises removing a first portion of the resist pattern while leaving a second portion of the resist pattern in place, and wherein the first portion of the resist pattern represents a maximum amount that may be removed from the resist pattern and still allow the resist pattern to be capable of providing an etch mask;
    removing the second portion of the resist pattern;
    etching the second region of the nitride layer;
    etching the first region of the third oxide layer and the second region of the oxide layer; and
    etching the first region of the hard mask layer and the second region of the silicon layer to form a fin for a multi-gate transistor.

11. The method of claim 10, wherein forming the resist pattern comprises a trim step.

12. The method of claim 10, wherein the hard mask layer comprises at least one of silicon rich nitride or silicon oxynitride.

13. The method of claim 10, wherein etching the second region of the third oxide layer, the hard mask layer, and the second oxide layer consumes part of the resist pattern and comprises a timed etch.

14. The method of claim 13, wherein the timed etch has a duration between about 30 and 60 seconds.

15. The method of claim 10, wherein the nitride layer comprises a carbon doped nitride layer.

* * * * *

UNITED STATES PATENT AND TRADEMARK OFFICE
CERTIFICATE OF CORRECTION

| | |
|---|---|
| PATENT NO. | : 7,666,796 B2 |
| APPLICATION NO. | : 11/388526 |
| DATED | : February 23, 2010 |
| INVENTOR(S) | : Ban et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 834 days.

Signed and Sealed this

Fourth Day of January, 2011

David J. Kappos
*Director of the United States Patent and Trademark Office*